(12) United States Patent
Ichikawa

(10) Patent No.: US 6,794,891 B2
(45) Date of Patent: Sep. 21, 2004

(54) SEMICONDUCTOR INTEGRATED CIRCUIT

(75) Inventor: Takeshi Ichikawa, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/421,853

(22) Filed: Apr. 24, 2003

(65) Prior Publication Data
US 2004/0046586 A1 Mar. 11, 2004

(30) Foreign Application Priority Data
Sep. 5, 2002 (JP) ....................... 2002-260318

(51) Int. Cl.[7] ............................................. G01R 31/26
(52) U.S. Cl. .................. 324/765; 324/763; 714/724
(58) Field of Search ................................. 324/731, 765, 324/719, 537, 691, 158.1, 76.61; 438/17, 11; 365/201

(56) References Cited

U.S. PATENT DOCUMENTS 6,275,434 B1 * 8/2001 Yamada et al. ............. 365/206
6,496,429 B2 * 12/2002 Murai et al. ................ 365/200

FOREIGN PATENT DOCUMENTS

| JP | 01-260375 | 10/1989 |
|---|---|---|
| JP | 06-003424 | 1/1994 |
| JP | 10-021150 | 1/1998 |
| JP | 11-014704 | 1/1999 |
| JP | 2001319494 A | 11/2001 |
| JP | 2002-041178 | 2/2002 |
| JP | 2002-243801 | 8/2002 |

* cited by examiner

Primary Examiner—Kamand Cuneo
Assistant Examiner—Trung Q. Nguyen
(74) Attorney, Agent, or Firm—Volentine Francos, PLLC

(57) ABSTRACT

The control unit 21 takes in a test command and expected value data from input terminals 11 and 12 respectively, to output via an internal bus 30 the command to the function block 31 etc. and the expected value data to a decision unit 40. A processing result of the function block 31 etc. is provided to the decision unit 40, where it is compared to the expected value data in order to decide acceptability of the function block 31 etc. The decision result is held in an output unit 50 and output from an output terminal 104 etc. Such a configuration provides a semiconductor integrated circuit which can easily adjust the timing in a test operation mode and reduce the number of external terminals.

22 Claims, 9 Drawing Sheets

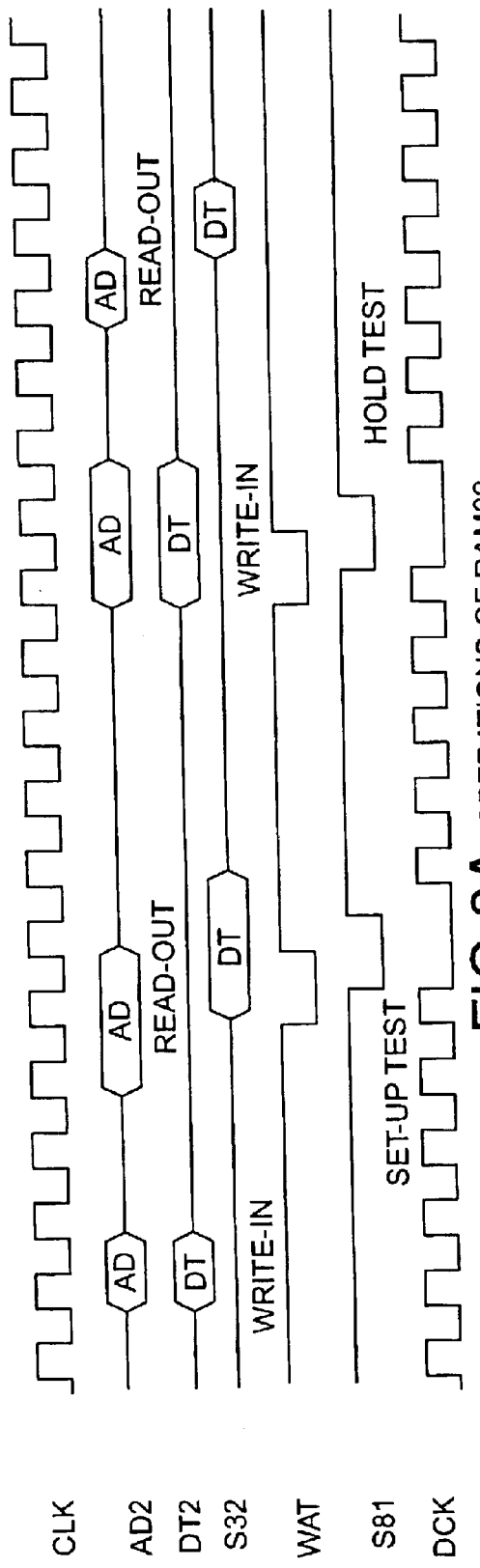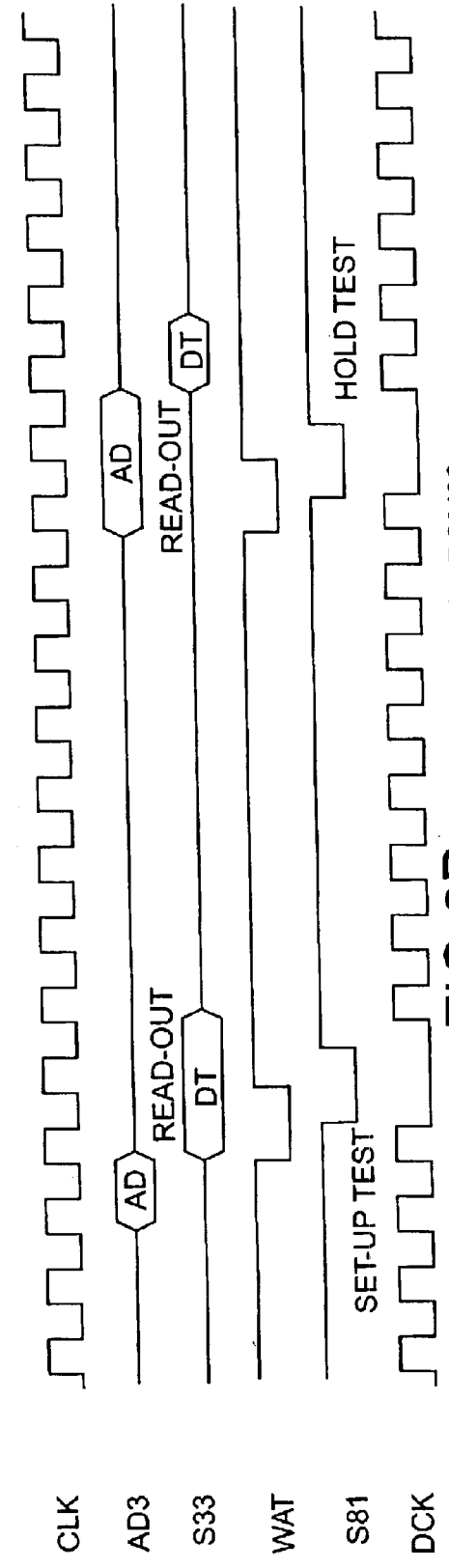

SEMICONDUCTOR INTEGRATED CIRCUIT

BACKGROUND OF THE INVENTION

The present invention relates to a semiconductor integrated circuit (IC) provided with a test circuit.

FIG. 2 is a configuration diagram for showing one example of a semiconductor IC provided with a conventional test circuit.

This semiconductor IC is provided with input terminals 11–14 for receiving a test command etc. The input terminals 11 and 12 are provided to receive an 11-bit address signal AD and 16-bit data DT in parallel respectively, while the input terminal 13 is provided to receive a mode signal MD which performs switching between a test operation and an ordinary operation. The input terminals 11–13 are connected to a control unit 21 which controls this entire semiconductor IC.

The input terminal 14, on the other hand, is provided to receive a clock signal CK having a frequency required for the test operation and the ordinary operation, to which input terminal 14 are there connected a multiply unit 22 and a terminal B of a selector (SEL) 23. The multiply unit 22 is comprised of a Phase Locked Loop (PLL) etc., for multiplying a frequency (for example, 8 MHz) of the clock signal CK applied in the ordinary operation mode by, for example, eight to provide a frequency of 64 MHz. The output of the multiply unit 22 is connected to a terminal A of the selector 23.

In response to the mode signal MD provided at its terminal S, the selector 23 selectively outputs a signal of either one of the terminals A and B, in such a manner that the signal of the terminal A would be selected when an ordinary operation is specified and that of the terminal B would be selected when a test operation is specified by this mode signal MD. The signal thus selected by the selector 23 is provided as a clock signal CLK to the control unit 21.

To the control unit 21 are there connected via an internal bus 30 a test-subject function block 31, a Random Access Memory (RAM) 32, a Read Only Memory ROM (ROM) 33, and other function blocks 34, 35, ... The RAM32, ROM33, and the function blocks 31, 34, ... are supplied with the clock signal from the selector 23. Furthermore, the outputs of the test-subject function block 31, the RAM32, and the ROM33 are connected respectively to output terminals 101, 102, and 103 for outputting a 16-bit test result signal therefrom.

The following will describe the operations.

In this semiconductor IC, to conduct an operation confirmation test on the function block 31, the RAM32, and the ROM33, a test apparatus is connected to the input terminals 11–14 and output terminals 101–103, to supply the mode signal from the input terminal 13 in order to specify a test operation. In such a manner, the control unit 21 is set into a test operation mode and, furthermore, the terminal B is selected by the selector 23.

Next, the clock signal CK having a frequency of 64 MHz is supplied from the input terminal 14, so that in synchronization with this clock signal CK, the address signal AD and the data DT are provided in parallel from the input terminals 11 and 12 respectively. These address signal AD and data DT thus provided in synchronization with the clock signal CK are taken into the control unit 21, in which these signals are given through the internal bus 30 to the function block 31 etc. A processing result of the function block 31 and data items read out from the RAM32 and the ROM33 are output in parallel from the output terminals 101–103 respectively.

The test apparatus can check the processing result and the data thus output from the output terminals 101–103 to confirm whether the function block 31, the RAM32, and the ROM33 are operating properly.

The semiconductor IC, on the other hand, is used in the ordinary operation mode after its functions are confirmed. In the ordinary operation mode, it is supplied at its input terminal 13 with the mode signal MD which specifies an ordinary operation and at its input terminal 14 with the clock signal CK having a frequency of 8 MHz. In such a manner, the control unit 21 is set into the ordinary operation mode and also the terminal A is selected by the selector 23. Then, the clock signal CLK having a frequency of 64 MHz obtained as a result of multiplication at the multiply unit 22 is supplied to the control unit 21, the respective function blocks 31, 34, ..., the RAM32, and the ROM33. Based on programs and data stored in the ROM33, the control unit 21 performs predetermined processing.

In such a manner, in the test operation mode, without using the multiply unit 22, the clock signal CK is directly supplied from the input terminal 14 to the control unit 21 and the function block 31 etc. It is thus possible to conduct an operation test at an arbitrary timing without taking into account operation stabilization time or a shift in phase which are caused by the multiply unit 22.

The conventional semiconductor IC, however, has the following problems.

The high-speed clock signal CK which is originally to undergo frequency multiplication at the multiply unit 22 and be supplied needs to be supplied from the outside via the input terminal 14 and, furthermore, it is necessary to input the address signal AD and the data DT in synchronization with this clock signal CK from the input terminals 11 and 12 respectively and also to externally monitor signals indicative of the operation results output from the output terminals 101–103, thus making it difficult to adjust the timing. Furthermore, the signals are input and output respectively from the input terminals 11 and 12 and the output terminals 101–103 in parallel, thus giving rise to a problem that a number of external terminals are necessary.

SUMMARY OF THE INVENTION

It is an object of the invention to provide a semiconductor IC which can solve the above-mentioned problems of the conventional technologies, to facilitate timing adjustment in a test operation mode and reduce the number of external terminals.

To solve the above-mentioned problems, claims 1–11 of the invention provide a semiconductor IC having a plurality of function blocks and a control unit which controls the function blocks in accordance with a predefine program in an ordinary operation mode and tests a test-subject function block in accordance with a supplied command in a test operation mode, comprising a decision unit which, in the test operation mode, comparing data which is output from the test-subject function block in response to the command and expected value data which is provided corresponding to the command to each other in order to decide acceptability of a function of the function block and an output unit which holds a decision result given by the decision unit and outputs the decision result to an output terminal.

The semiconductor IC according to any one of claims 1–11 of the invention is constituted as described above and so has the following actions in the test operation mode.

For example, a test command and expected value data which corresponds to the command are provided as serial data from the outside and then converted into parallel data and stored in an instruction storage unit, from which the command is read out by the control unit so that a test-subject function block may be tested in accordance with the command. Data which is output from the test-subject function block in response to this command is compared to the expected value data at the decision unit, to decide acceptability of a function of the function block. A decision result given by the decision unit is held in the output unit and output to the output terminal.

Claims 12–15 of the invention provide a semiconductor IC having a plurality of function blocks including a memory and a control unit which controls the function blocks in accordance with a predefined program in an ordinary operation mode and tests a test-subject function block in accordance with a supplied command in a test operation mode, comprising a delay unit which delays a clock signal to be supplied to the memory, based on a wait signal sent from the test-subject function block, a decision unit which compares, to each other, data which is output from the test-subject function block in response to the command and expected value data which is provided corresponding to the command to thereby decide acceptability of the function block, and an output unit which holds a decision result given by the decision unit and outputs the decision result to an output terminal.

In the semiconductor IC according to any one of claims 12–15 of the invention, especially in testing of the memory, the clock signal to be supplied to this memory is delayed by the delay unit based on the wait signal. Therefore, it is easy to conduct an address set-up test and a data-hold test on the memory.

BRIEF DESCRIPTION OF THE DRAWINGS

While the specification concludes with claims particularly pointing out and distinctly claiming the subject matter which is regarded as the invention, it is believed that the invention, the objects, features and advantages thereof will be better understood from the following description taken in connection with the accompanying drawings in which:

FIG. 8 is a timing chart for showing test operations of FIG. 7; and

DETAILED DESCRIPTION OF THE PREFERRED EMBODIMENTS (First Embodiment)

Figure 1:
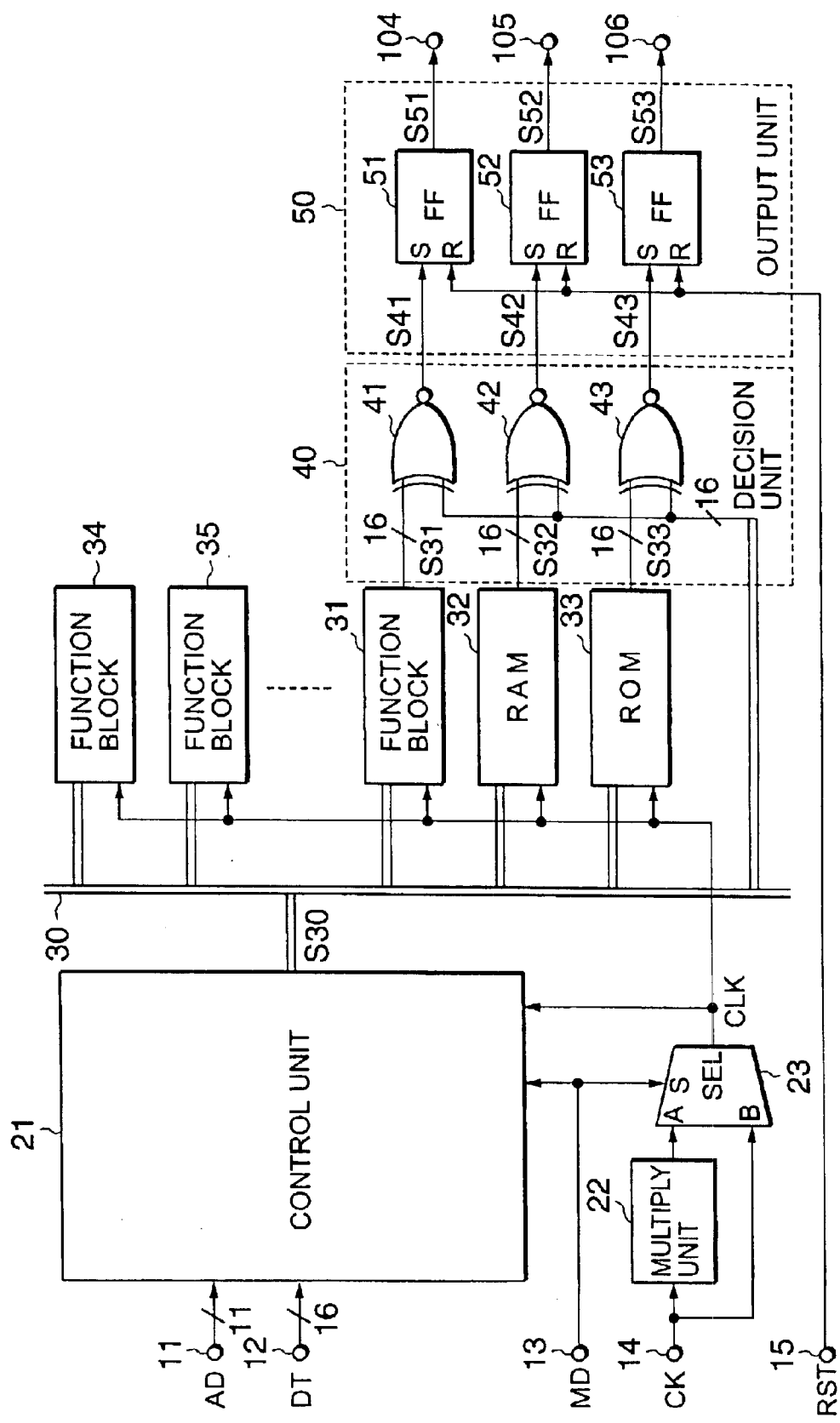
FIG. 1 is a block diagram of a semiconductor IC for showing a first embodiment of the invention.
Figure 2:
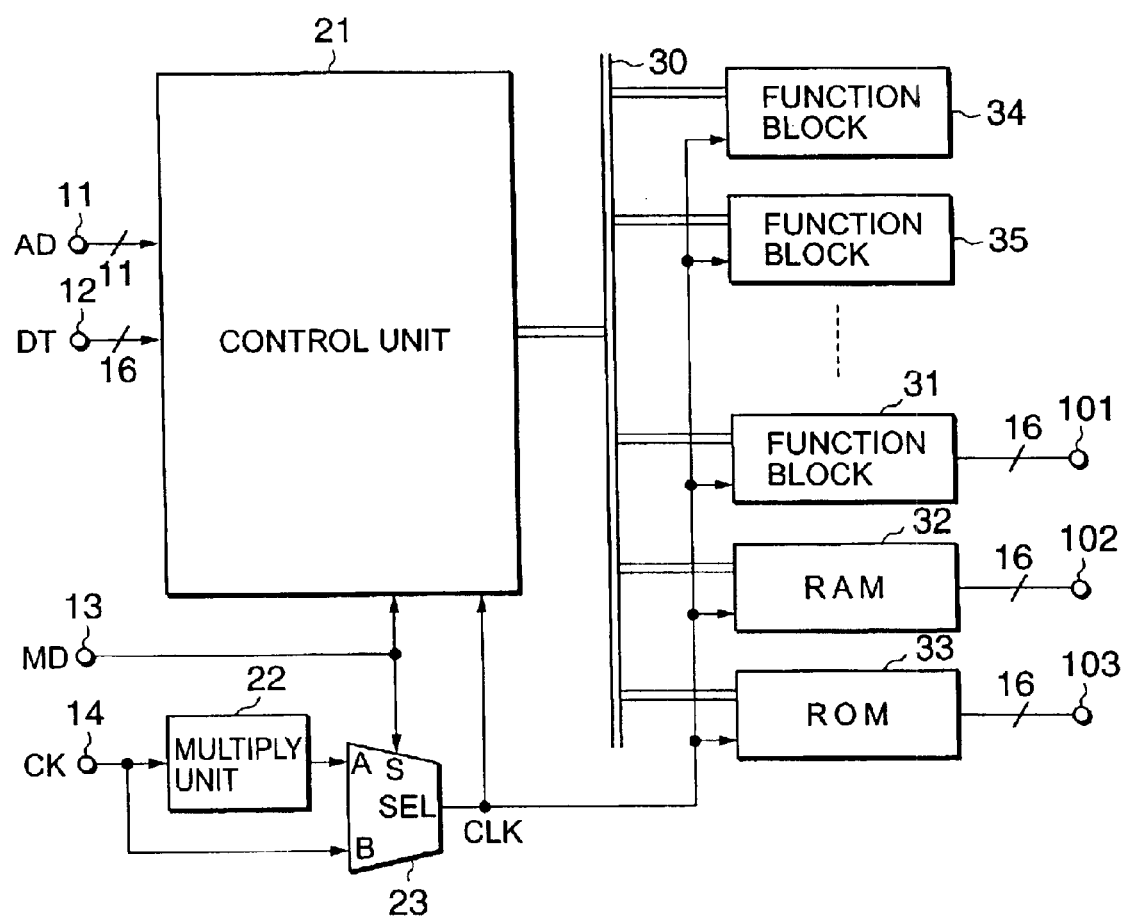
FIG. 2 is a block diagram for showing one example of a semiconductor IC provided with a test circuit.

FIG. 1 is a block diagram of a semiconductor IC for showing a first embodiment of the invention, components which are shown there and common to those shown in FIG. 2 are indicated by the same reference numerals.

As in the case of FIG. 2, this semiconductor IC of FIG. 1 comprises input terminals 11–14, a control unit 21, a multiply unit 22, a selector 23, an internal bus 30, function blocks 31, 34, 35, . . . , a RAM32, and a ROM33.

The input terminals 11 and 12 are provided to receive in parallel an 11-bit address signal AD and 16-bit data DT which constitute a test command etc., while the input terminal 13 is provided to receive a mode signal MD which performs switching between a test operation and an ordinary operation. These input terminals 11–13 are connected to the control unit 21. The control unit 21 uses a microprocessor etc. to conduct control on overall operations including the test operation and the ordinary operation of this semiconductor IC.

The input terminal 14, on the other hand, is provided to receive a clock signal CK having a frequency required for the test operation and the ordinary operation, which input terminal 14 is connected to a multiply unit 22 and a terminal B of a selector 23. The multiply unit 22 is comprised of a PLL etc., for multiplying a frequency (for example, 8 MHz) of the clock signal CK applied in the ordinary operation mode by, for example, eight to provide a frequency of 64 MHz. The output of the multiply unit 22 is connected to a terminal A of the selector 23.

In response to the mode signal MD provided at its terminal S, the selector 23 selectively outputs a signal of either one of the terminals A and B, in such a manner that the signal of the terminal A would be selected when an ordinary operation is specified by this mode signal MD and that of the terminal B would be selected when a test operation is specified by this mode signal MD. The signal thus selected by the selector 23 is provided as a clock signal CLK to the control unit 21, the function blocks 31, 34, 35, . . . , the RAM32, and the ROM33.

To the control unit 21 are there connected via the internal bus 30 a test-subject function block 31, the RAM32, the ROM33, and the other function blocks 34 etc. Furthermore, the outputs of the test-subject function block 31, the RAM32, and the ROM33 are connected to a decision unit 40.

The decision unit 40 compares, to each other, 16-bit expected value data which is provided from the input terminal 12 via the control unit 21 and the internal bus 30 and 16-bit data indicative of a processing result which is output from the RAM32 and the ROM33, to decide acceptability of the function block etc. This decision unit 40 is comprised of coincidence detection circuits 41, 42, and 43 which are each made up of, for example, an E-NOR (negation of an exclusive logical sum) gate and, if these two data items coincide with each other, outputs a HIGH level signal and, otherwise, outputs a LOW level signal. The output of the decision unit 40 is connected to an output unit 50.

The output unit 50 holds and outputs a decision result given by the decision unit 40 and is comprised of, for example, set/reset-type Flip-Flops (FFs) 51, 52, and 53. The FFs51–53 are reset simultaneously by a reset signal RST provided from the input terminal 15 and set by the HIGH-level signal output from the coincidence detection circuits 41–43 of the decision unit 40 respectively. The outputs of the FFs51–53 are connected to output terminals 104, 105, and 106 respectively.

Figure 3:
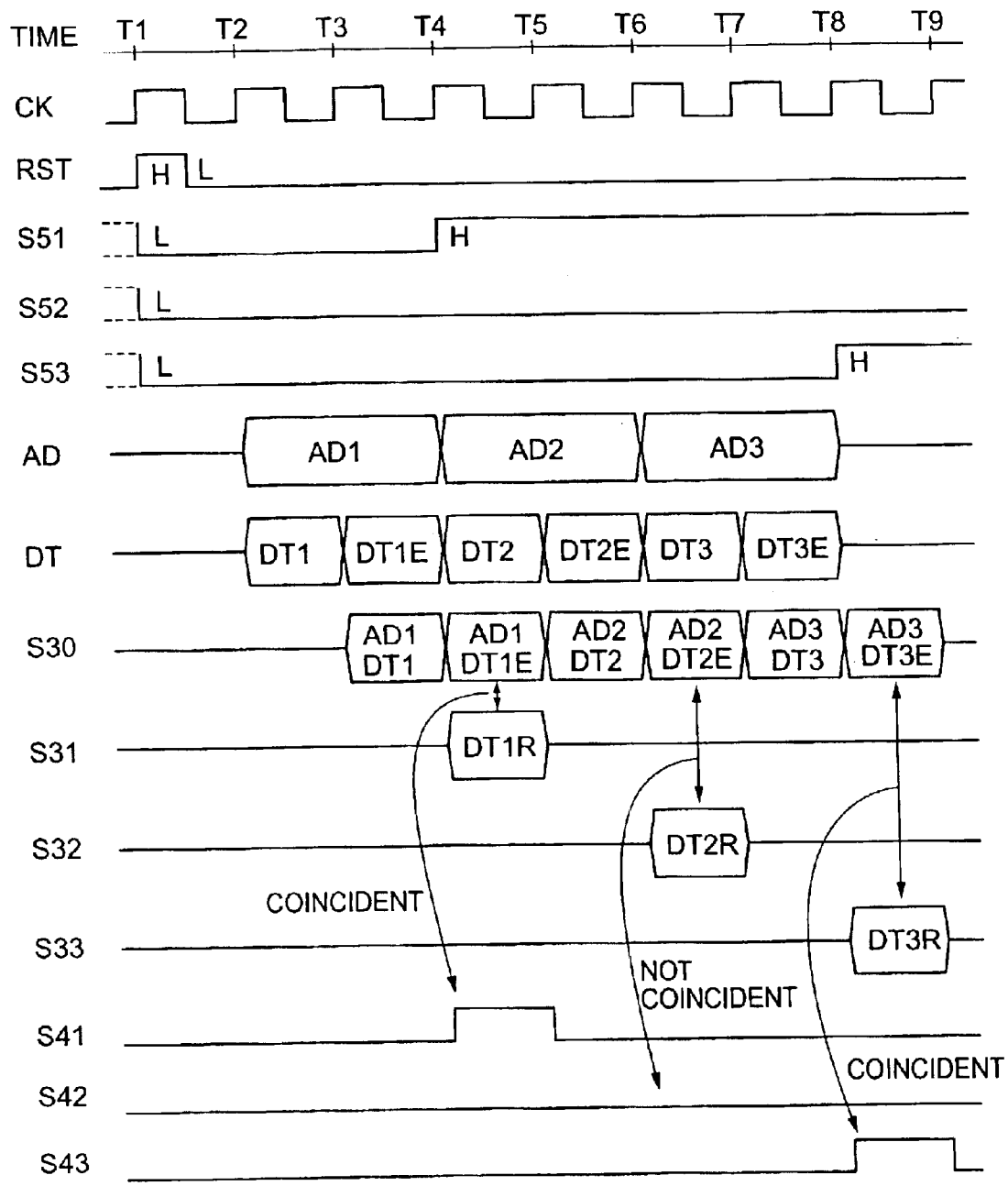
FIG. 3 is a timing chart for showing test operations of FIG. 1.

FIG. 3 is a timing chart for showing operations of FIG. 1. The following will describe the operations of FIG. 1 with reference to FIG. 3.

In the case of this semiconductor IC, to confirm and test the operations of the function block 31, the RAM32, and the ROM33, a test apparatus is connected to the input terminals 11–15 and the output terminals 104–106, to specify a test operation by supplying the mode signal MD from the input terminal 13. Thus, the control unit 21 is set into the test operation mode and also the terminal B is selected by the selector 23.

First, the test apparatus starts supplying the clock signal CK having a frequency of 64 MHz from the input terminal 14 and, at the same time, inputs the reset signal RST from the input terminal 15 at a moment T1 in FIG. 3. Therefore, the control unit 21 and the other circuits in this semiconductor IC are reset along with the FFs51–53 of the output unit 50, so that signals S51–S53 output from these FFs51–53 to the output terminals 104–106 respectively all become LOW in level.

Next, in synchronization with the leading edge of the clock signal CK at a moment T2, an address signal AD1 and test data DT1 for the function block 31 are supplied in parallel from the input terminals 11 and 12 respectively.

Accordingly, the address signal AD1 and the test data DT1 are taken into the control unit 21 and, in synchronization with the leading edge of the clock signal CK at the next moment T3, output to the internal bus 30 as a signal S30.

At the moment T3, the data DT to be provided to the input terminal 12 is switched to expected value data DT1E of a processing result of the data DT1 by the function block 31. The function block 31 supplied with the data DT1 via the internal bus 30, on the other hand, performs processing on this data DT1.

In synchronization with the leading edge of the clock signal CK at a moment T4, the expected value data DTI E is output from the control unit 21 to the internal bus 30. A signal S31 to be output from the function block 31 becomes the processing result data DT1R. Accordingly, the expected value data DT1E on the internal bus 30 and the processing result data DT1R of the function block 31 are compared to each other by the coincidence detection circuit 41. If these two data items coincide with each other, a signal S41 of the coincidence detection circuit 41 becomes HIGH in level, to set the FF51 of the output unit 50, thus causing its signal S51 to become HIGH in level.

At the leading edge of the clock signal CK at the moment T4, an address signal AD2 and test data DT2 for the RAM32 are provided from the input terminals 11 and 12 respectively. Accordingly, the address signal AD2 and the test data DT2 are taken into the control unit 21, thus subsequently conducting a test on the RAM32 similarly.

For example, if data DT2R output from the RAM32 does not coincide with expected value data DT2E, a signal S42 of the coincidence detection circuit 42 is LOW in level and so the FF52 of the output unit 50 stays as reset, with its signal S52 being LOW in level.

The semiconductor IC with its functions as confirmed completely, on the other hand, is used in the ordinary operation mode. In the ordinary operation mode, the input terminal 13 is supplied with the mode signal MD which specifies an ordinary operation, while the input terminal 14 is supplied with the 8-MHz clock signal. Accordingly, the control unit 21 is set into the test operation mode and also the terminal A is selected by the selector 23. Then, the clock signal CLK having a frequency of 64 MHz which is obtained as a result of multiplication at the multiply unit 22 is supplied to the control unit 21, each of the function blocks 31, 34, . . . , the RAM32, and the ROM33. This causes the control unit 21 to perform predetermined processing based on the program and data stored in the ROM33.

Thus, the semiconductor IC according to the present first embodiment has the decision unit 40 which compares data of a processing result output from the test-subject function block 31 etc. and expected value data to each other to thereby decide acceptability of a function thereof and the output unit 50 which holds a decision result given by this decision unit 40 and outputs the decision result as 1-bit signal for each of the function blocks. Thus, it is advantageously possible to easily adjust timings for checking a test result and also to reduce the number of external terminals greatly.

(Second Embodiment)

Figure 4:
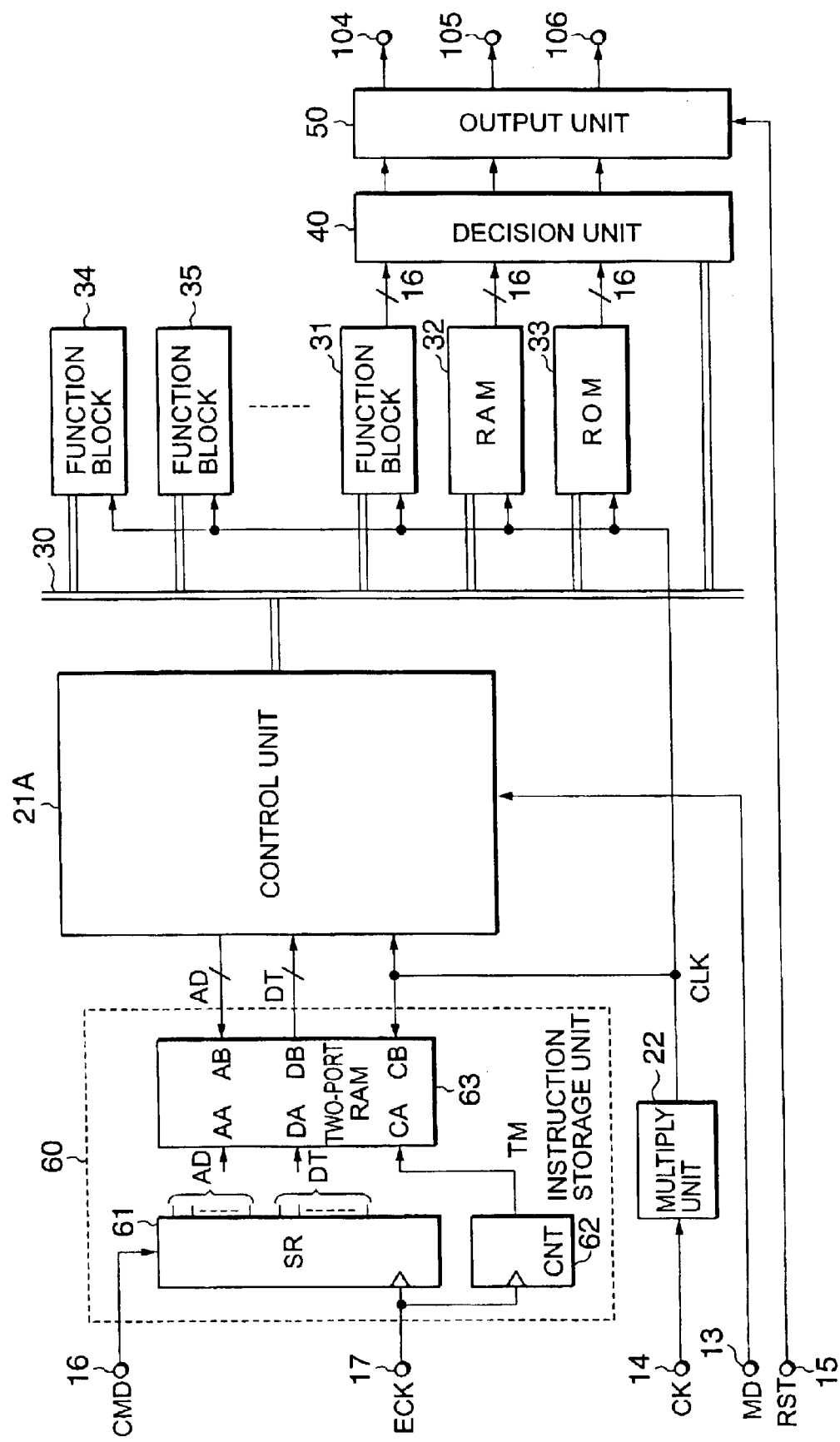
FIG. 4 is a block diagram of a semiconductor IC for showing a second embodiment of the invention.

FIG. 4 is a block diagram of a semiconductor IC for showing a second embodiment of the invention, components which are shown there and common to those shown in FIG. 1 are indicated by the same reference numerals.

This semiconductor IC is provided with, in place of the control unit 21 in its counterpart of FIG. 1, a control unit 21A which conducts somewhat different control in a test operation mode and an addition of an instruction storage unit 60 which stores a test command etc. to be supplied to this control unit 21A. Furthermore, this semiconductor IC is arranged to eliminate the selector 23 shown in FIG. 1 so that a clock signal CLK with its frequency as multiplied at a multiply unit 22 may be used not only in an ordinary operation mode but also in a test operation mode. The other configuration components are the same as those of FIG. 1.

It is to be noted here that the instruction storage unit 60 is arranged to convert a test command signal CMD supplied in series from an input terminal 16 into parallel data and store it so as to provide it to the control unit 21A and comprised of a serial-input/parallel-output type shift register 61, a binary counter 62, and a two-port RAM63.

The shift register 61 shifts the test command signal CMD serially supplied in 27-bit units from the input terminal 16 in synchronization with an external clock signal ECK supplied from an input terminal 17 and holds it to output it as 27-bit parallel data. The binary counter 62, on the other hand, generates a timing signal TM which is used to write parallel data held in the shift register 61 into the two-port RAM63 each time the 27-bit command signal CMD is received.

The two-port RAM63 has two such input/output ports A and B that the same storage region can be accessed from either of them independently of each other. An address terminal AA and a data terminal DA of the port A are respectively supplied with an 11-bit address signal AD and a 16-bit data DT which are output from the shift register 61, while a clock terminal CA is supplied with the timing signal TM from the binary counter 62.

An address terminal AB and a data terminal DB of the port B, on the other hand, are connected to the control unit 21A, while a clock terminal CB is supplied with the clock signal CLK from the multiply unit 22.

The following will describe the operations.

In this semiconductor IC, before an operation confirmation test is conducted on the function block 31, the RAM32, and the ROM33, a series of test commands are written into the instruction storage unit 60, from which are then read out the commands, to conduct the operation confirmation tests on these sequentially.

In this command write-in operation, specifically, in synchronization with the external clock signal ECK supplied to the input terminal 17, the command signal CMD consisting of the 16-bit data DT and the 11-bit address signal AD is input serially from the input terminal 16 into the shift register 61. Simultaneously, the external clock signal ECK is counted at the binary counter 62.

At the same timing as the 27-bit command signal CMD is input to the shift register 61, the timing signal TM is output from the binary counter 62, to write in a command that corresponds to a predetermined address of the two-port RAM63. From the input terminal 16, a plurality of the test commands CMD are sequentially input and stored in a predetermined storage region of the two-port RAM63.

When the series of commands are written into the instruction storage unit 60 completely, the mode signal MD which is input to the input terminal 13 is provided to specify a test operation so as to switch the control unit 21A into the test operation mode. Furthermore, the 8-MHz clock signal CK starts to be supplied from the input terminal 14. Accordingly, the clock signal CK undergoes frequency multiplication by a factor of eight at the multiply unit 22 to provide a 64-MHz clock signal CLK, which is supplied to the control unit 21A and the function block 31 etc.

Then, the address signal AD for read-out of a command is output from the control unit 21A to the instruction storage unit 60, so that in response to this address signal AD, corresponding data DT is read out from the two-port RAM63 of the instruction storage unit 60. The read out data DT is output from the control unit 21A to the internal bus 30 together with the address signal AD which specifies the function block 31, the RAM32, the ROM33, etc.

The subsequent operations including processing in the function block 31, the RAM32, and the ROM33, comparison by the decision unit 40 between a processing result output from the function block 31 etc. and expected value data, and holding and outputting of a comparison result by the output unit 50 are the same as those of the first embodiment.

As described above, the semiconductor IC according to the present second embodiment has the instruction storage unit 60 which stores a serial command as converted into parallel data and, in accordance with a read-out request from the control unit 21A, outputs it. Besides the advantages of the first embodiment, it is thus possible to greatly reduce the number of required input terminals (27→2). Furthermore, a command can be read out from this instruction storage unit 60 based on the 64-MHz clock signal CLK generated by the multiply unit 22, to advantageously adjust the timing easily and internally without externally providing the clock signal CK having a high frequency of 64 MHz.

(Third Embodiment)

Figure 5:
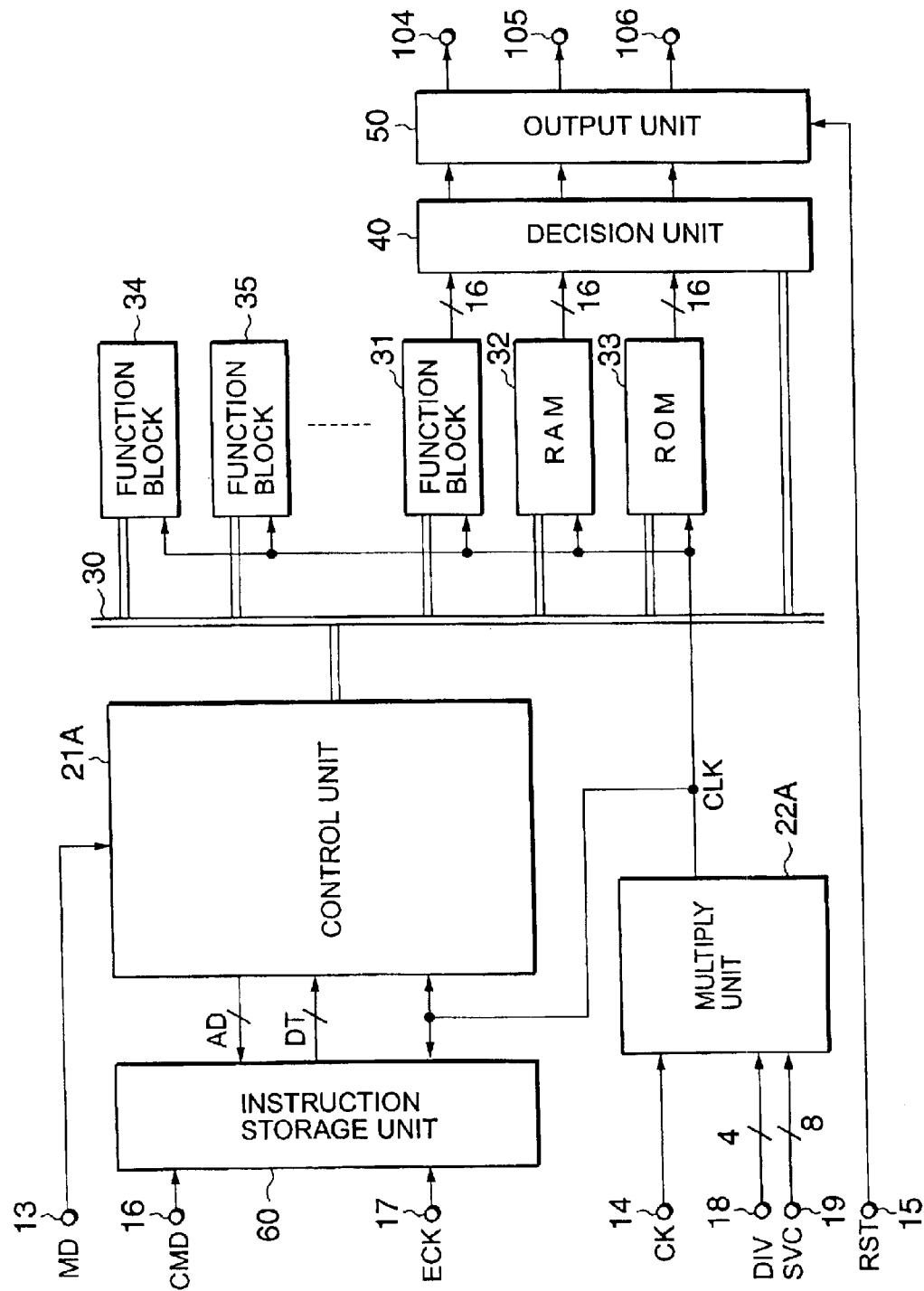
FIG. 5 is a block diagram of a semiconductor IC for showing a third embodiment of the invention.

FIG. 5 is a block diagram of a semiconductor IC for showing a third embodiment of the invention, components which are shown there and common to those shown in FIG. 4 are indicated by the same reference numerals.

This semiconductor IC is provided with, in place of the multiply unit 22 in its counterpart of FIG. 4, a multiply unit 22A which performs somewhat different multiplication.

That is, the multiply unit 22A is provided to multiply a frequency of a clock signal CK supplied to an input terminal 14 by a factor of SVC/DIV based on a 4-bit control signal DIV and an 8-bit control signal SVC which are supplied from input terminals 18 and 19 respectively. The clock signal CK undergoes frequency multiplication at the multiply unit 22A to provide a clock signal CLK, which is supplied to internal circuits such as a control unit 21A, an instruction storage unit 60, and a function block 31 etc. The other configuration components are the same as those of FIG. 4.

This semiconductor IC operates in the same manner as that of FIG. 4 except that the clock signal CK undergoes frequency multiplication by a factor of SVC/DIV at the multiply unit 22A based on the control signals DIV and SVC supplied from the input terminals 18 and 19 respectively and is supplied as the clock signal CLK to the internal circuits.

As described above, the semiconductor IC according to the present third embodiment has the multiply unit 22A that can control the multiplication factor of the clock signal CK based on the control signals SVC and DIV. Therefore, besides the advantages of the second embodiment, the present embodiment gives an advantage that a test can be conducted using the clock signal CLK having an arbitrary frequency.

(Fourth Embodiment)

Figure 6:
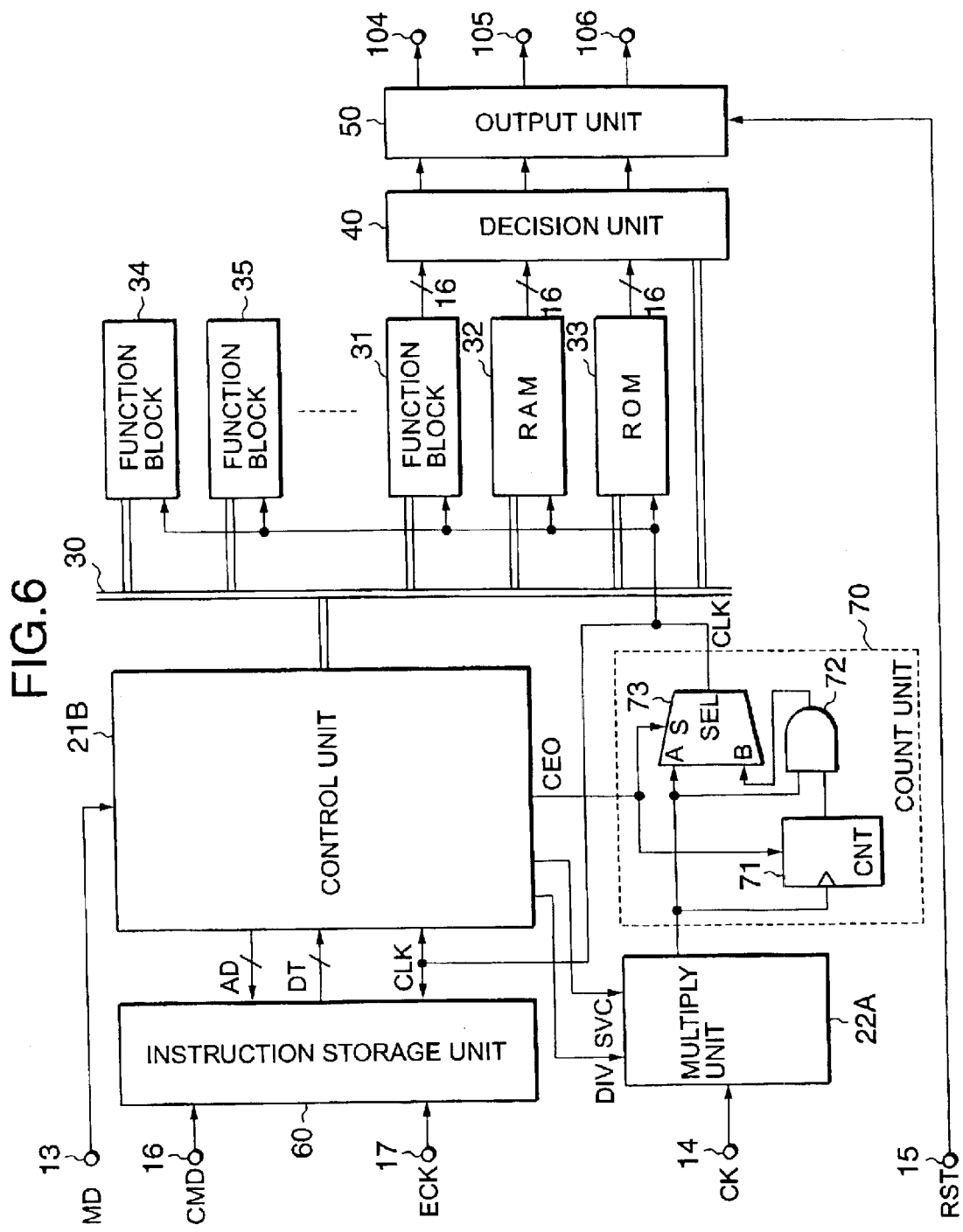
FIG. 6 is a block diagram of a semiconductor IC for showing a fourth embodiment of the invention.

FIG. 6 is a block diagram of a semiconductor IC for showing a fourth embodiment of the invention, components which are shown there and common to those shown in FIG. 5 are indicated by the same reference numerals.

This semiconductor IC is provided with, in place of the control unit 21A in its counterpart of FIG. 5, a control unit 21B which has a somewhat different function and an addition of a count unit 70 on the output side of a multiply unit 22A. Furthermore, control signals SVC and DIV for the multiply unit 22A are supplied not from an input terminal but from the control unit 21B, while at the same time a control signal CEO for the count unit 70 is supplied from this control unit 21B.

When supplied with a control signal CEO, the count unit 70 suspends supplying a clock signal CLK only for a constant time lapse, thus adjusting the clock signal CLK to be supplied to internal circuits such as an instruction storage unit 60 and a function block 31 etc. This count unit 70 is comprised of a counter (CNT) 71, an AND (logical product gate) 72, and a selector 73. The output of the multiply unit 22A is connected to a clock signal terminal C of the counter 71, a first input of the AND72, and a terminal A of the selector 73. The output of the counter 71 is connected to a second input of the AND72, the output of which is connected to a terminal B of the selector 73.

When supplied at its Enable terminal E with the control signal CEO having a HIGH level, the counter 71 starts counting the clock signal CK supplied at the clock signal terminal C and, when its count value reaches a constant value, holds the HIGH level signal and outputs it. It is to be noted that when the count value is less than the constant value, the output signal of the counter 71 stays at a LOW level. The selector 73, on the other hand, selects the terminal A or B when the control signal CEO supplied at its select terminal S is LOW or HIGH in level respectively. The other configuration components are the same as those of FIG. 5.

The following will describe the operations.

Immediately after a test operation starts, the control signal CEO having the LOW level is output from the control unit 21B and, at the same time, the control signals DIV and SVC are read out based on, for example, a command which is stored in the instruction storage unit 60 and provided to the multiply unit 22A. Accordingly, at the multiply unit 22A, the clock signal CK is multiplied in accordance with the control signals DIV and SVC and output as the clock signal CLK to the count unit 70.

The count unit 70 is supplied, from the control unit 21B, with the control signal CEP of the LOW level as much as a few clock pulses which are output immediately after the start of the test operation and then with the control signal CEO of the HIGH level. Accordingly, during a time lapse of the few clock pulses immediately after the start of the test operation, the terminal A of the selector 73 are held as selected, to output the clock signal CLK.

Then, the control signal CEO becomes HIGH in level, to select the terminal B of the selector 73. At this moment, the output signal of the counter 71 is at the LOW level, so that the AND72 provides a LOW output, thus suspending outputting the clock signal CLK from the count unit 70.

When the count value reaches the constant value owing to the operation of the counter 71, this counter 71 provides a HIGH output signal, to cause the AND72 to output the clock signal CLK, thus restarting to output the clock signal CLK from the count unit 70. The subsequent test operations are the same as those of the third embodiment.

As described above, the semiconductor IC according to the fourth embodiment has the control unit 21B which provides the control signals SVC and DIV for the multiply unit 22A and so, besides the advantages of the fourth embodiment, is able to further reduce the number of external terminals. Furthermore, it has the count unit 70 which suspends supply of the clock signal CLK only for the predetermined time lapse based on the control signal CEO and so can suspend supply of the clock signal CLK only for a constant time lapse immediately after the start of the test operation, during which the operation of the multiply unit 22A is not stable, thus advantageously conducting a stable test.

(Fifth Embodiment)

Figure 7:
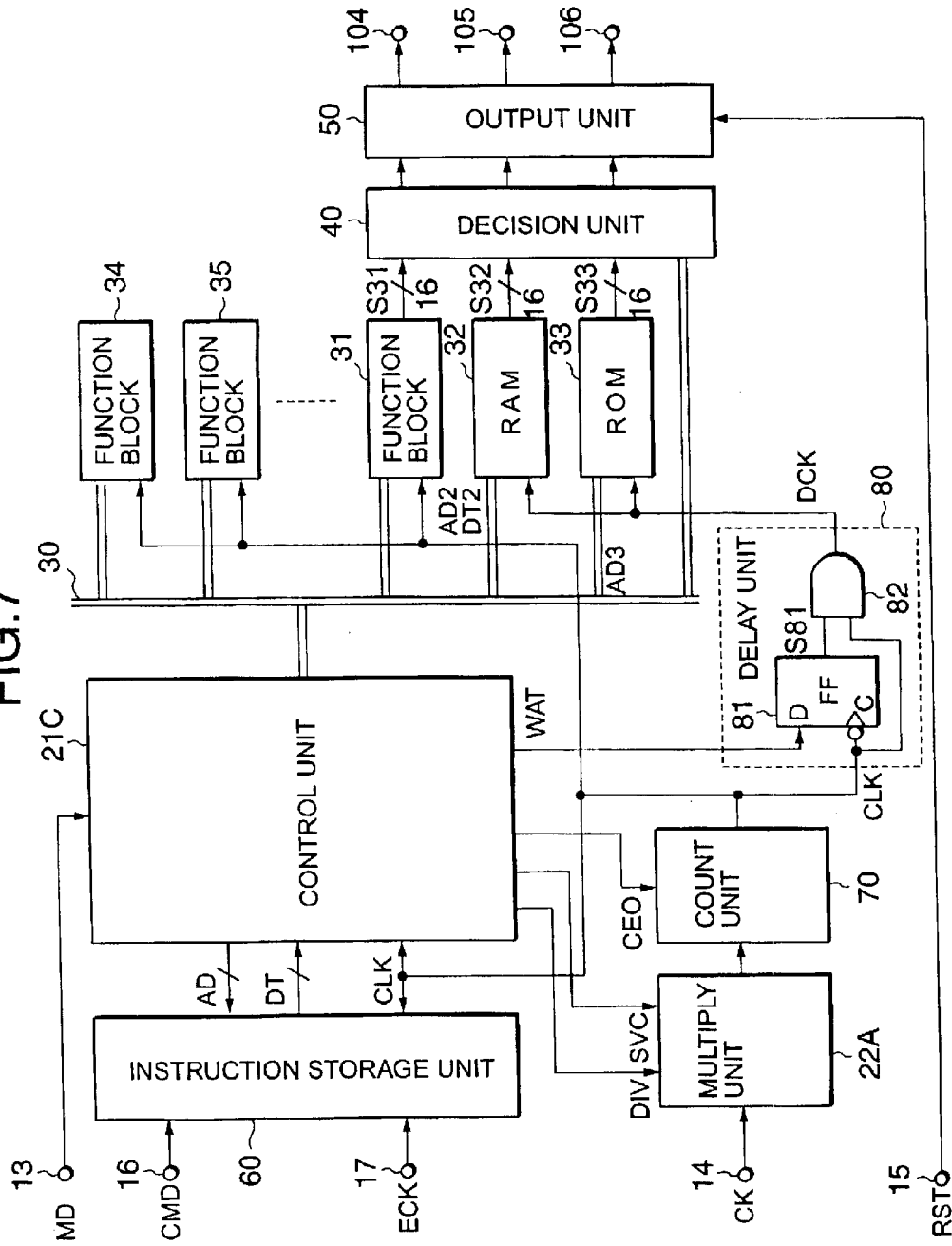
FIG. 7 is a block diagram of a semiconductor IC for showing a fifth embodiment of the invention.

FIG. 7 is a block diagram of a semiconductor IC for showing a fourth embodiment of the invention, components which are shown there and common to those shown in FIG. 6 are indicated by the same reference numerals.

This semiconductor IC comprises the configuration components of FIG. 6 plus a delay unit 80 which generates a delay clock signal DCK to conduct an access test on a RAM32 and a ROM33 as well as a control unit 21C in place of the control unit 21B.

The delay unit 80 is comprised of an FF81 and an AND82. The FF81 holds and outputs a signal applied to a terminal D in synchronization with the trailing edge of a clock signal CLK applied to a terminal C from a count unit 70, to which terminal D is specifically supplied a wait signal WAT from a control unit 21C. The output of the FF81 is connected to a first input of the AND82, to a second input of which is supplied the clock signal CLK.

Therefore, when the wait signal WAT is HIGH in level, the clock signal CLK is output as it is from the AND82 as the delay clock signal DCK, while when this wait signal WAT is LOW in level, the pulse of the clock signal CLK is turned LOW in level and output as the delay clock signal DCK. The delay clock signal DCK is supplied to the RAM32 and the ROM33. To the function block 31 etc. is supplied the clock signal CLK from the count unit 70 as in the case of FIG. 6.

FIGS. 8A and 8B are timing charts for showing test operations of FIG. 7; specifically, FIG. 8A shows operations of the RAM32 and FIG. 8B, those of the ROM33. The following will describe the operations of FIG. 7 with reference to FIGS. 8A and 8B. It is to be noted that test operations conducted on the function block 31 in this semiconductor IC are the same as those of the fourth embodiment.

As shown in FIG. 8A, in a set-up test of the RAM32, in a period of data write-in to this RAM32, the wait signal WAT having a HIGH level is output, to perform an ordinary write-in operation. Next, in a period of data read-out from the RAM32, the wait signal WAT having a LOW level is output, to prolong a time lapse of data read-out from this RAM32 from one cycle in an ordinary case to two cycles. Therefore, it is possible to surely perform an operation of read-out from the RAM32 without being restricted by the frequency of the clock signal CLK, thus correctly verifying a state of data write-in to this RAM32.

In a hold test of the RAM32, in a period of data write-in to the RAM32, the wait signal WAT having the low level is output, to prolong a time lapse of outputting an address signal and data to this RAM32 to two cycles. Next, in a period of read-out from the RAM32, the wait signal WAT having the HIGH level is output, to perform an ordinary read-out operation. Therefore, it is possible to surely perform an operation of write-in to the RAM32 without being restricted by the frequency of the clock signal CLK, thus correctly verifying a state of data readout from this RAM32.

As shown in FIG. 8B, in a set-up test of the ROM33, in a period of outputting the address signal to this ROM33, the wait signal WAT having the HIGH level is output, to perform an ordinary operation. Next, in a period of data read-out from the ROM33, the wait signal WAT having the LOW level is output, to prolong a time lapse of data read-out from this ROM33 to two cycles. Therefore, it is possible to surely perform an operation of read-out from the ROM33 without being restricted by the frequency of the clock signal CLK, thus correctly verifying a state of the address signal set-up to this ROM33.

In a hold test of the ROM33, in a period of outputting the address signal to the ROM33, the wait signal WAT having the LOW level is output, to prolong a time lapse of outputting the address signal to this ROM33 to two cycles. Next, in a period of read-out from the ROM33, the wait signal WAT having the HIGH level is output, to perform an ordinary read-out operation. Therefore, it is possible to surely output the address signal to the ROM33 without being restricted by the frequency of the clock signal CLK, thus correctly verifying a state of data read-out from this ROM33.

As described above, the semiconductor IC according to the present fifth embodiment has the delay unit 80 which provides the delay clock signal DCK to the RAM32 and the ROM33 in response to the wait signal WAT. Accordingly, besides the advantages of the fourth embodiment, the present embodiment can advantageously conduct the address set-up test and the data hold test on the RAM32 and the ROM33 easily and in detail without being restricted by the frequency of the clock signal CLK.

(Sixth Embodiment)

Figure 9:
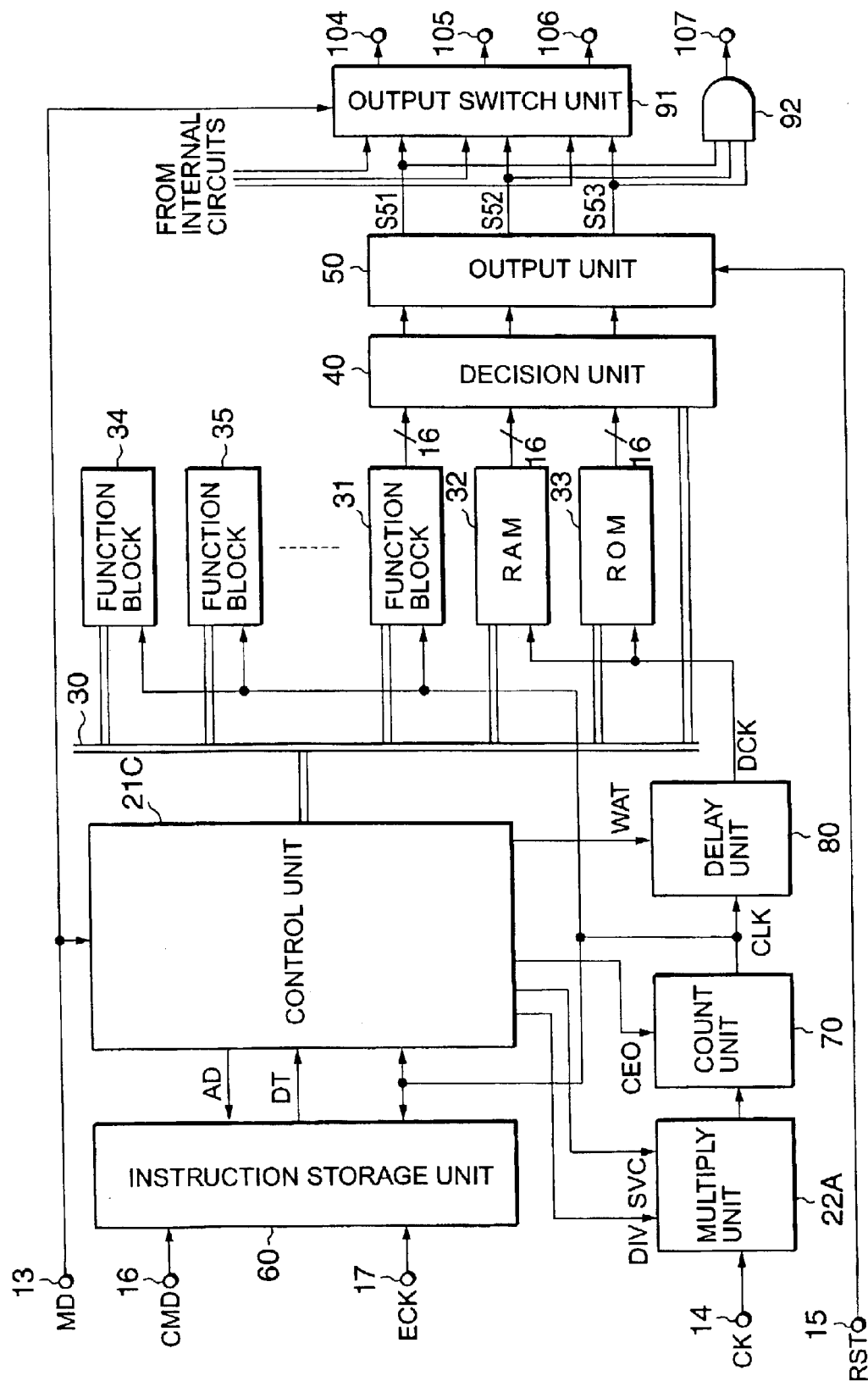
FIG. 9 is a block diagram of a semiconductor IC for showing a sixth embodiment of the invention.

FIG. 9 is a block diagram of a semiconductor IC for showing a sixth embodiment of the invention, components which are shown there and common to those shown in FIG. 7 are indicated by the same reference numerals.

This semiconductor IC comprises the configuration components of FIG. 7 plus an output switch unit 91 and a three-input AND92 for display output. The output switch unit 91 performs switching between signals S51 through S53 provided from an output unit 50 and a signal which is externally provided from an internal circuit not shown, based on a mode signal MD, and outputs them to output terminals 104–106. The AND92, on the other hand, takes a logical product of the signals S51 through S53 supplied from the output unit 50 and outputs its result as an output signal S92. The output of the AND92 is connected to an output terminal 107. The other configuration components are the same as those of FIG. 7.

When a test operation is specified by the mode signal MD, the output switch unit 91 selects the signals S51 through S53 of the output unit 50 and outputs them to the output terminals 104–106. If an ordinary operation is specified by the mode signal MD, on the other hand, the output switch 91 selects the signal of the internal circuit and outputs it to the output terminals 104–106. Accordingly, the output terminals can be shared in use when outputting the external signal in the ordinary operation mode and outputting the signal indicative of a test result in the test operation mode, thus reducing the number of external terminals.

The AND92, on the other hand, takes a logical product of the signals S51 through S53 and outputs it from the output terminal 107. Therefore, when the signals S51 through S53 are all HIGH in level, that is, all the decision results at the decision unit 40 come up with "coincidence", a HIGH-level signal is output from the output terminal 107. Accordingly, by connecting thereto an indicator element such as, for example, a Light Emitting Diode (LED), acceptability of the test results can be displayed easily.

As described above, the semiconductor IC according to the present sixth embodiment comprises the output switch unit 91 which performs switching between the signal S51 through S53 indicative of test results and the external output signal in the ordinary operation mode based on the mode signal MD and outputs them to the output terminals 104–106, thus enabling reducing the number of external terminals. It further comprises the AND92 which consolidates the signals S51 through S53 indicative of the test results, thus enabling advantageously displaying the test results easily on an LED etc.

It is to be noted that the invention is not limited to the above-mentioned embodiments in application and may be varied variously. The variants include the following.

(a) The configurations of the decision unit 40 and the output unit 50 in FIG. 1 are not limited to those shown therein. Any other circuit configuration is applicable as far as it gives equivalent functions.

(b) The configuration of the instruction storage unit 60 in FIG. 4 is not limited to that shown therein. Any other configuration is applicable as far as it is capable of converting a command given as serial data into parallel data and storing it.

(c) The configurations of the count unit 70 in FIG. 6 and the delay unit 80 in FIG. 7 are not limited to those shown therein. Any other circuit configuration is applicable as far as it gives equivalent functions.

(d) Although in FIG. 9 the AND92 is used to consolidate the signals S51 through S53 to generate a signal for use in LED display etc., it may be necessary to use a NOR (negation of logical sum) gate etc. to combine the signals S51 through S53 if the LOW level is output in the case of coincidence.

(e) Although the function block 31, the RAM32, and the ROM33 have been described as a test-subject function block, any circuit may be subject to test.

(f) Although the instruction storage unit 60 is arranged to receive an arbitrary test command from the outside and store it, a ROM which stores the test commands beforehand may be used in place of the instruction storage unit 60 as far as test contents are predefined. Furthermore, if the ROM33 has an unused region which can store test commands, it is possible to store these test commands in that unused region and use part thereof as the instruction storage unit. Thus, the circuit configuration can be simplified.

As detailed above, a semiconductor IC according to any one of claims 1–11 of the invention has a decision unit which compares, to each other, data output from a test-subject function block and expected value data correspondingly provided beforehand to thereby decide acceptability of functions of this function block and an output unit which holds a decision result given by this decision unit and outputs it to an output terminal. Accordingly, it is possible to facilitate timing adjustment in the test operation mode and also to reduce the number of external terminals.

A semiconductor IC according to any one of claims 12–15 of the invention has a delay unit which delays a clock signal to be supplied to a memory based on a wait signal when a test operation is performed on the memory. Accordingly, it is possible to conduct an address set-up test and a data hold test on the memory easily.

What is claimed is:

1. A semiconductor integrated circuit comprising:

a plurality of function blocks;

an instruction storage unit receiving the command and expected value data which corresponds to the command as serial data in synchronization with an external clock signal to then convert the serial data into parallel data and store the parallel data.

a control unit controlling the function blocks in accordance with a predefined program in an ordinary operation mode and testing a test-subject function block in accordance with a given command in a test operation mode;

a decision unit comparing, to each other, data which is output from the test-subject function block in response to the command and expected value data which is given corresponding to the command, to decide acceptability of a function of the function block in the test operation mode; and an output unit holding a decision result given by the decision unit and outputting the decision result to an output terminal.

2. The semiconductor integrated circuit according to claim 1, wherein the semiconductor integrated circuit further comprises a multiply unit multiplying a frequency of the clock signal which is provided from an outside by a predetermined multiplication factor to then supply a resultant clock signal to the control unit and the function blocks in the test operation mode.

3. The semiconductor integrated circuit according to claim 2, wherein the semiconductor integrated circuit further comprises an adjustment unit which is arranged to provide the multiply unit with the predetermined multiplication factor as the command from the instruction storage unit via the control unit and also which suspends output of the clock signal generated at the multiply unit during a time lapse of a predetermined number of clock pulses starting from a moment at which a test operation starts, based on a control signal sent from the control unit.

4. The semiconductor integrated circuit according to claim 3, wherein a frequency which is output from the multiply unit becomes roughly constant within a time lapse of a predetermined number of clock pulses starting from a moment at which the test operation starts.

5. The semiconductor integrated circuit according to claim 3, wherein the adjustment unit includes a counter counting the clock signal which is generated at the multiply unit.

6. The semiconductor integrated circuit according to claim 1, wherein the semiconductor integrated circuit further comprises an instruction storage unit which is constituted of a read-only memory which stores beehand the command and expected value data that corresponds to the command.

7. The semiconductor integrated circuit according to claim 6, wherein the semiconductor integrated circuit further comprises a multiply unit multiplying a frequency of the clock signal which is provided from an outside by a predetermined multiplication factor to then supply a resultant clock signal to the control unit and the function blocks in the test operation mode.

8. The semiconductor integrated circuit according to claim 7, wherein the semiconductor integrated circuit further comprises an adjustment unit which is arranged to provide the multiply unit with the predetermined multiplication factor as the command from the instruction storage unit via the control unit and also which suspends output of the clock signal generated at the multiply unit during a time lapse of a predetermined number of clock pulses starting from a moment at which a test operation starts, based on a control signal sent from the control unit.

9. The semiconductor integrated circuit according to claim 8, wherein a frequency which is output from the multiply unit becomes roughly constant within a time lapse of a predetermined number of clock pulses starting from a moment at which the test operation starts.

10. The semiconductor integrated circuit according to claim 8, wherein the adjustment unit includes a counter counting the clock signal which is generated at the multiply unit.

11. The semiconductor integrated circuit according to claim 6, wherein one of the plurality of function blocks is a read-only memory, in an empty region of which is provided the instruction storage unit.

12. The semiconductor integrated circuit according to claim 1, wherein the semiconductor integrated circuit further comprises an instruction storage unit which is constituted of a read-only memory which stores beehand the command and expected value data that corresponds to the command.

13. The semiconductor integrated circuit according to claim 12, wherein the semiconductor integrated circuit further comprises a multiply unit multiplying a frequency of the clock signal which is provided from an outside by a predetermined multiplication factor to then supply a resultant clock signal to the control unit and the function blocks in the test operation mode.

14. The semiconductor integrated circuit according to claim 13, wherein the semiconductor integrated circuit further comprises an adjustment unit which is arranged to provide the multiply unit with the predetermined multiplication factor as the command from the instruction storage unit via the control unit and also which suspends output of the clock signal generated at the multiply unit during a time lapse of a predetermined number of clock pulses starting from a moment at which a test operation starts, based on a control signal sent from the control unit.

15. The semiconductor integrated circuit according to claim 14, wherein a frequency which is output from the multiply unit becomes roughly constant within a time lapse of a predetermined number of clock pulses starting from a moment at which the test operation starts.

16. The semiconductor integrated circuit according to claim 14, wherein the adjustment unit includes a counter counting the clock signal which is generated at the multiply unit.

17. The semiconductor integrated circuit according to claim 12, wherein one of the plurality of function blocks is a read-only memory, in an empty region of which is provided the instruction storage unit.

18. The semiconductor integrated circuit according to claim 1, wherein the semiconductor integrated circuit further comprises, between the output unit and the output terminal, an output switch unit selecting an output signal which is output to an outside from an internal circuit in an ordinary operation mode and a signal which is output from the output unit in a test operation mode and providing the output signal or the signal which is thus selected to the output terminal.

19. The semiconductor integrated circuit according to claim 1, wherein the semiconductor integrated circuit further comprises a display output unit displaying a decision result output from the output unit to an outside.

20. A semiconductor integrated circuit comprising:
a plurality of function blocks including a memory;
storage unit receiving the command and expected value data which corresponds to the command as serial data in synchronization with an external clock signal to then convert the serial data into parallel data and store the parallel data;
a control unit controlling the function blocks in accordance with a predefined program in an ordinary operation mode and testing a test-subject function block in accordance with a given command in a test operation mode;
a delay unit delaying a clock signal, which is supplied to the memory in accordance with a wait signal sent from the test-subject function block when a test operation is performed on the memory;
a decision unit comparing, to each other, data which is output from the test-subject function block in response to the command and expected value data which is given corresponding to the command, to decide acceptability of a function of the function block in the test operation mode;
and an output unit holding a decision result given by the decision unit to then output the decision result to an output terminal.

21. The semiconductor integrated circuit according to claim 20, wherein the semiconductor integrated circuit further comprises a multiply unit multiplying a frequency of the clock signal which is provided from an outside by a predetermined multiplication factor to then supply a resultant clock signal to the control unit and the function blocks in the test operation mode.

22. The semiconductor integrated circuit according to claim 21, wherein the semiconductor integrated circuit further comprises an adjustment unit which is arranged to provide the multiply unit with the predetermined multiplication factor as the command from the instruction storage unit via the control unit and also which suspends output of the clock signal generated at the multiply unit during a time lapse of a predetermined number of clock pulses starting from a moment at which a test operation starts, based on a control signal sent from the control unit.

* * * * *